United States Patent
Nethercutt

(10) Patent No.: US 9,250,156 B2
(45) Date of Patent: Feb. 2, 2016

(54) TECHNIQUES FOR EVALUATING PERFORMANCE OF INTERNAL COMBUSTION ENGINE COMPONENTS

(71) Applicant: Cummins Inc., Columbus, IN (US)

(72) Inventor: Jeremy Nethercutt, Morgantown, IN (US)

(73) Assignee: Cummins Inc., Columbus, IN (US)

( * ) Notice: Subject to any disclaimer, the term of this patent is extended or adjusted under 35 U.S.C. 154(b) by 382 days.

(21) Appl. No.: 13/628,214

(22) Filed: Sep. 27, 2012

(65) Prior Publication Data

US 2014/0085069 A1 Mar. 27, 2014

(51) Int. Cl.
| | |
|---|---|
| *B60Q 1/00* | (2006.01) |
| *G01M 15/05* | (2006.01) |
| *G01R 31/00* | (2006.01) |
| *G07C 5/08* | (2006.01) |
| *B60H 1/00* | (2006.01) |
| *F02N 15/10* | (2006.01) |

(52) U.S. Cl.
CPC .............. *G01M 15/05* (2013.01); *B60H 1/00* (2013.01); *G01R 31/006* (2013.01); *G07C 5/0808* (2013.01); *F02N 15/10* (2013.01); *F02N 2200/04* (2013.01); *F02N 2200/063* (2013.01)

(58) Field of Classification Search
CPC ..... F01P 11/16; B60C 23/20; F16D 2066/001
USPC .............. 340/425.5, 438, 449, 901, 902, 904, 340/500, 501, 540, 286.01; 116/28 R, 28.1
See application file for complete search history.

(56) References Cited

U.S. PATENT DOCUMENTS

| | | | |
|---|---|---|---|
| 5,634,443 A | 6/1997 | Mathews | |
| 6,646,561 B1* | 11/2003 | Zur | G01R 31/3693 324/428 |
| 7,472,695 B2 | 1/2009 | Prust et al. | |
| 7,631,552 B2* | 12/2009 | Keski-Hynnila | G01M 15/05 73/114.74 |
| 2010/0012068 A1* | 1/2010 | Rodriguez | F02M 31/13 123/179.3 |

FOREIGN PATENT DOCUMENTS

| | | |
|---|---|---|
| EP | 0965746 A1 | 12/1999 |
| EP | 1136695 B1 | 5/2005 |

* cited by examiner

*Primary Examiner* — George Bugg
*Assistant Examiner* — Anthony D Afrifa-Kyei
(74) *Attorney, Agent, or Firm* — Taft, Stettinius & Hollister LLP

(57) ABSTRACT

One embodiment is a unique strategy for evaluating performance of a component of an internal combustion engine. More particularly, in one non-limiting form a method includes operating a component, such as a heating component, and measuring a first characteristic related to its operation. The method also includes operating an engine accessory and measuring a second characteristic related to its operation, and determining performance of the component by relating the first and second characteristics to one another. In one aspect, relating the first and second characteristics to one another provides a first value which is compared to a predetermined value, and performance of the component is determined from this comparison. Other embodiments include unique methods, systems, and apparatus for evaluating or monitoring the performance of a component of an internal combustion engine, and/or for performing a procedure for starting the internal combustion engine.

30 Claims, 6 Drawing Sheets

1

TECHNIQUES FOR EVALUATING PERFORMANCE OF INTERNAL COMBUSTION ENGINE COMPONENTS

BACKGROUND

The present application relates generally to operation of internal combustion engines, and more particularly but not exclusively to evaluating performance of components used on or in connection with an internal combustion engine for, by way of non-limiting example, determining if a component is properly functioning. Additionally or alternatively, the present application also relates to procedures for starting internal combustion engines.

Modern internal combustion engines must meet stringent emissions standards, including a maximum amount of nitrogen oxides ($NO_x$), particulates and unburnt hydrocarbons that may be emitted. In certain situations, such as cold starting environments, ambient air may be heated by a heating component before it enters into the cylinders of the engine. Additionally or alternatively, heating components can be positioned in or around the cylinders in order to heat air in the cylinder and/or the engine block surrounding the cylinders. Heating in either of these manners tends to offset heat diffusion that occurs between compressed air in the cylinder and the surrounding engine block, which in turn improves combustion quality on start-up by providing higher compressed air temperatures that are necessary for generating and maintaining combustion of fuel in the compressed air in the cylinder. Amongst other things, improved combustion quality on engine start-up can reduce unburnt hydrocarbons and particulates in the engine exhaust.

In addition to the foregoing, many engines include aftertreatment systems which are utilized to reduce engine-out emissions to regulatory levels before release to the atmosphere. Aftertreatment systems often include multiple components, including particulate filters, oxidation catalysts, $NO_x$ adsorbers, $NO_x$ reduction catalysts, three-way catalysts, and four-way catalysts, and can further include multiple components of the same type at various locations along the aftertreatment system flowpath. Several of these components properly function only after reaching a certain temperature threshold, the achievement of which can be aided by improved combustion quality on engine start-up. As a corollary, improved combustion quality on engine start-up can also indirectly enhance reduction of engine-out emissions to regulatory levels.

While the foregoing heating techniques provide several advantages, there are a number of drawbacks in the current techniques used to evaluate the performance of the above-described heating components, as well as other engine components and accessories. By way of non-limiting example, variations in battery system life and configuration can impact the ability of current techniques to accurately evaluate the performance of heating or other components and accessories. Accordingly, there is a demand for further improvements in this area of technology.

SUMMARY

One embodiment is a unique strategy for evaluating performance of a component of an internal combustion engine. More particularly, in one non-limiting form a method includes operating a component, such as a heating component, and measuring a first characteristic related to its operation. The method also includes operating an engine accessory and measuring a second characteristic related to its operation, and determining performance of the component by relating the first and second characteristics to one another. In one aspect, relating the first and second characteristics to one another provides a first value which is compared to a predetermined value, and performance of the component is determined from this comparison. In a further aspect, the method also includes illuminating a malfunction indicator lamp in response to determining decreased performance of the component.

Other embodiments include unique methods, systems, and apparatus for evaluating or monitoring performance of a component of an internal combustion engine and/or for carrying out a procedure for starting the internal combustion engine.

Further embodiments, forms, objects, features, advantages, aspects, and benefits shall become apparent from the following description and drawings.

DESCRIPTION OF THE ILLUSTRATIVE EMBODIMENTS

Figure 1:
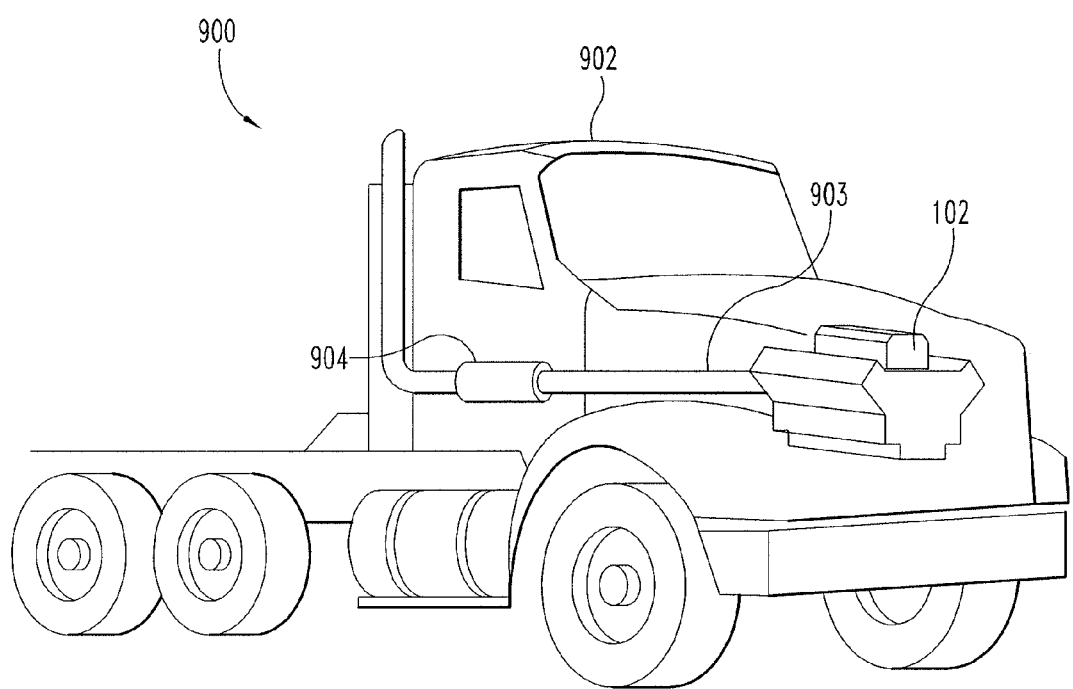
FIG. 1 is a schematic illustration of an application having an internal combustion engine and an aftertreatment system.

While the present invention can take many different forms, for the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications of the described embodiments, and any further applications of the principles of the invention as described herein are contemplated as would normally occur to one skilled in the art to which the invention relates.

In one embodiment, a unique strategy for evaluating performance of a component of an internal combustion engine is provided. More particularly, in one non-limiting form a method includes operating a component, such as a heating component, and measuring a first characteristic related to its operation. The method also includes operating an engine accessory and measuring a second characteristic related to its operation, and determining performance of the component by relating the first and second characteristics to one another. In one aspect, relating the first and second characteristics to one another provides a first value which is compared to a predetermined value, and performance of the component is determined from this comparison. In a further aspect, the method also includes illuminating a malfunction indicator lamp in response to determining decreased performance of the component. In other embodiments, unique techniques for performing start-up procedures of internal combustion engines are provided. Further details regarding these and other embodiments will be provided below.

FIG. 1 is a schematic illustration of an application 900 including a vehicle 902 that carries an internal combustion engine 102 from which an exhaust pathway 903 extends. In one embodiment, internal combustion engine 102 is a diesel engine, although other variations are possible. The application 900 includes an aftertreatment system 904 in exhaust pathway 903 that reduces exhaust emissions and may include one or more aftertreatment components including soot filters, catalyzed soot filters, $NO_x$ adsorbers, SCR catalyst components, and/or oxidation catalysts, just to providing a few non-limiting examples. The application 900 serves as an exemplary platform for the presently described systems, methods, techniques and apparatuses to evaluate performance of one or more components of internal combustion engine 102 and/or to carry out a start-up procedure of engine 102.

Figure 2:
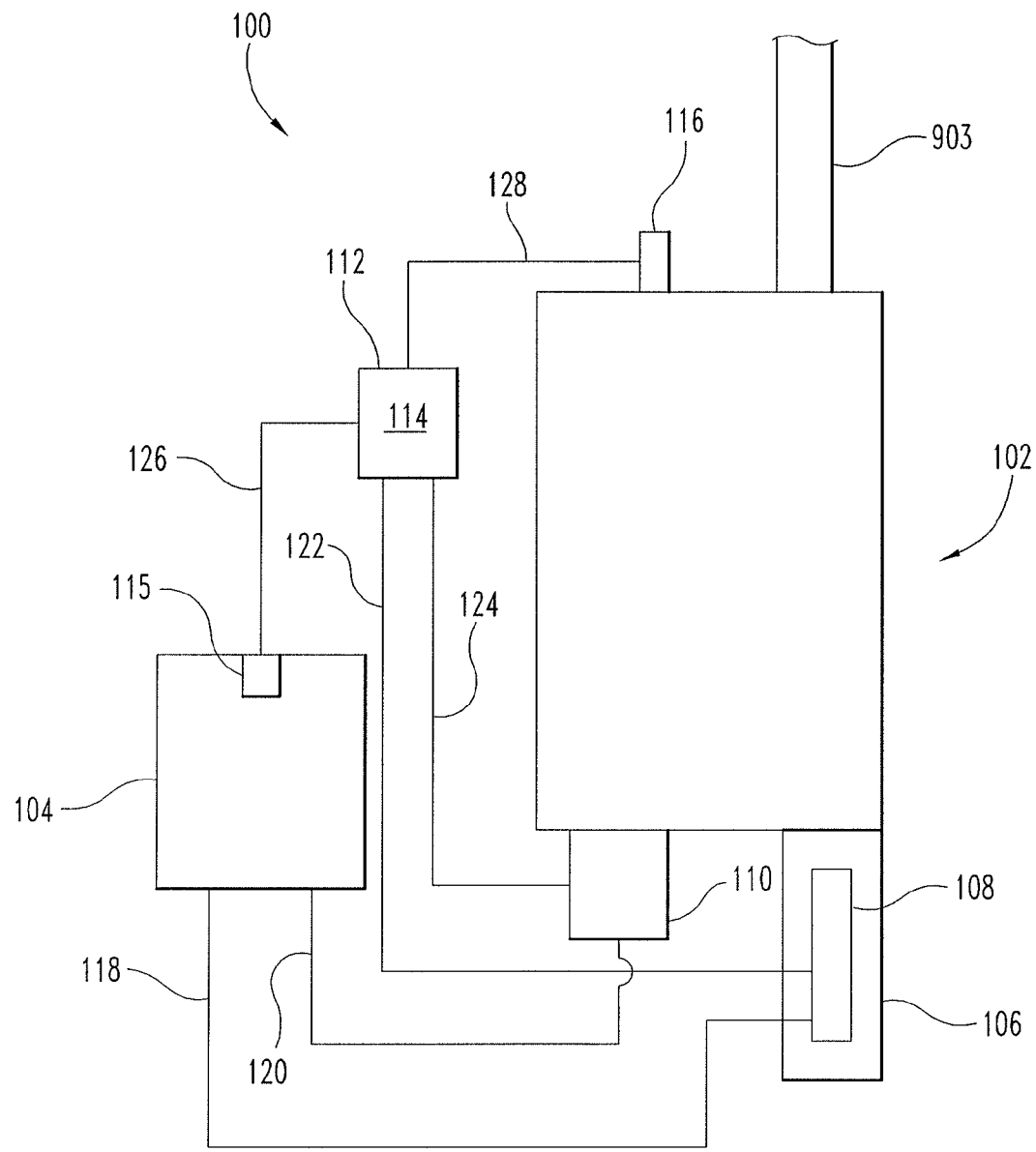
FIG. 2 is a schematic block diagram of a system for evaluating performance of a component of the internal combustion engine of FIG. 1.

FIG. 2 is a schematic illustration of a system 100 for evaluating performance of one or more components used on or in connection with internal combustion engine 102 and/or for carrying out a procedure for starting engine 102. In the illustrated embodiment, system 100 includes engine 102, battery system 104, air intake 106, intake heater 108 positioned in air intake 106, starter 110, a processing subsystem 112 including a controller 114, a sensor 115 associated with battery system 104, and an engine sensor 116 which may be configured to detect one or both of crankshaft movement or operation of engine 102. In one form, intake heater 108 includes one or more resistance heating elements configured to increase the temperature of ambient air that passes through intake 106 to engine 102. Still, other forms of intake heater 108 are also contemplated. In addition, battery system 104 may include one or more batteries, and when more than one battery is present, it should be understood that the specifications of each individual battery may vary from one to the other.

Electrical pathways 118, 120 extend between battery system 104 and intake heater 108 and starter 110, respectively, to provide power to intake heater 108 and starter 110 from battery system 104. In addition, electrical pathways 122, 124, and 128 extend between processing subsystem 112 and intake heater 108, starter 110, and sensor 116, respectively, to facilitate communication with controller 114. Electrical pathway 126 extends between battery system 104 and processing subsystem 112 to provide power to processing subsystem 112 and facilitate communication with controller 114. It should be understood that system 100 may include one or more components or features in addition to or in lieu of those illustrated in FIG. 2. In addition, the configuration of system 100 in FIG. 2 is non-limiting, and it should be appreciated that alternative configurations for system 100 are possible.

Processing subsystem 112 may be structured with controllers, modules, sensors, actuators, communication links, and other devices known in the art for performing the operations described herein. Controller 114 may be a single device or a distributed device, and the functions of controller 114 may be performed by hardware or software. All commands and information may be provided in alternate forms, some information may not be present in certain embodiments, and additional information may be present in certain embodiments. Information may be interpreted from sensor inputs, from datalink communications, from parameters on a storage medium readable by a computer, or through other information gathering devices understood in the art.

Figure 3:
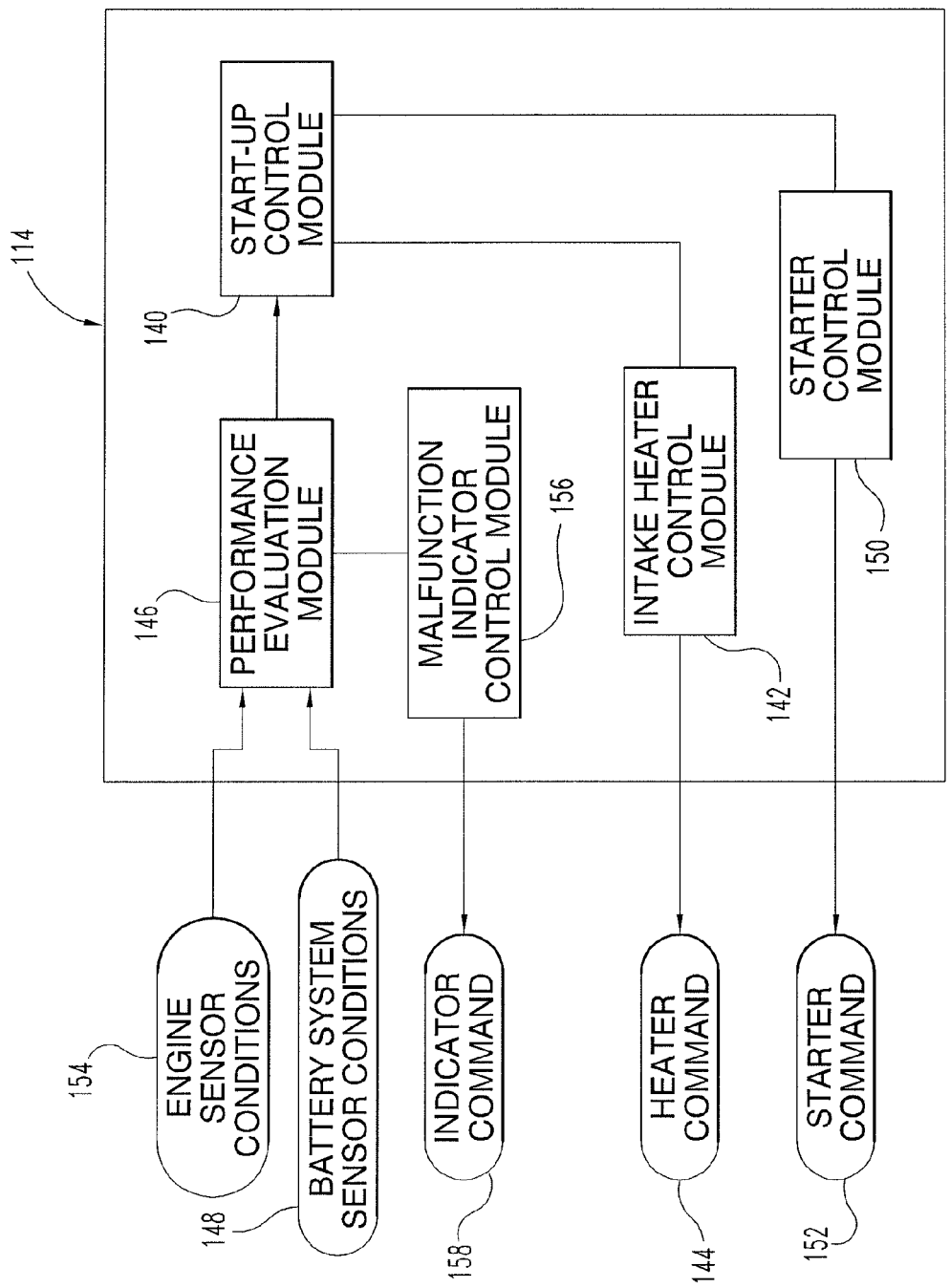
FIG. 3 is a schematic block diagram of a controller of the system illustrated in FIG. 2.

In certain embodiments, controller 114 includes one or more modules structured to functionally execute its operations. The description herein including modules emphasizes the structural independence of the aspects of controller 114, and illustrates one grouping of operations and responsibilities of controller 114. Other groupings that execute similar overall operations are understood within the scope of the present application. Modules may be implemented in hardware and/or software on computer readable medium, and modules may be distributed across various hardware or software components. It should also be understood that the illustrated modules may be integrated into a single control module or may be physically separated. More specific descriptions of certain embodiments of controller operations are provided below in connection with the schematic illustration of FIG. 3.

Controller 114 is generally structured to control operation of engine 102 and also evaluate performance of one or more components of engine 102. More specifically, in the illustrated form, controller 114 is configured to evaluate performance of intake heater 108, further details of which will be provided below. However, it should be appreciated that controller 114 may be configured to evaluate performance of one more components in addition to or in lieu of intake heater 108. For example, in one non-illustrated form, system 100 may include an in-cylinder heating component, such as a glow plug, in addition to or in lieu of intake heater 108 and, when present, controller 114 can be configured to evaluate its performance. Controller 114 may also be configured to evaluate performance of one or more of a fuel pump, a heater positioned in exhaust pathway 903 downstream of engine 102, or other accessories, just to provide a few non-limiting examples.

Controller 114 includes a start-up control module 140 configured for controlling and executing a starting procedure of engine 102 in response to activation of an engine ignition switch (not shown) or receiving an engine ignition command. More particularly, upon activation of the ignition switch, module 140 communicates with intake heater control module 142 which determines if operation of intake heater is necessary and, if so, provides heater command 144. Intake heater 108 is activated for a period of time in response to heater command 144 in order to heat ambient air as it passes through intake 106 to engine 102. A performance evaluation module 146 is configured to measure an operating characteristic of intake heater 108 during its operation. More particularly, in the illustrated form, module 146 is configured to control operation of sensor 115 such that it measures a voltage reduction (Heater_Delta) of battery system 104 incurred during operation of intake heater 108. In the form currently described, Heater_Delta refers to the amount by which the voltage of battery system 104 is reduced during operation of intake heater 108 and can be obtained by subtracting the voltage of battery system 104 measured during operation of intake heater 108 from the voltage of battery system 104 measured before operation of intake heater 108. In alternative forms, it should be understood that Heater_Delta may refer to a different value, such as the voltage of battery system 104 during operation of intake heater 108, just to provide one non-limiting example.

Figure 4:
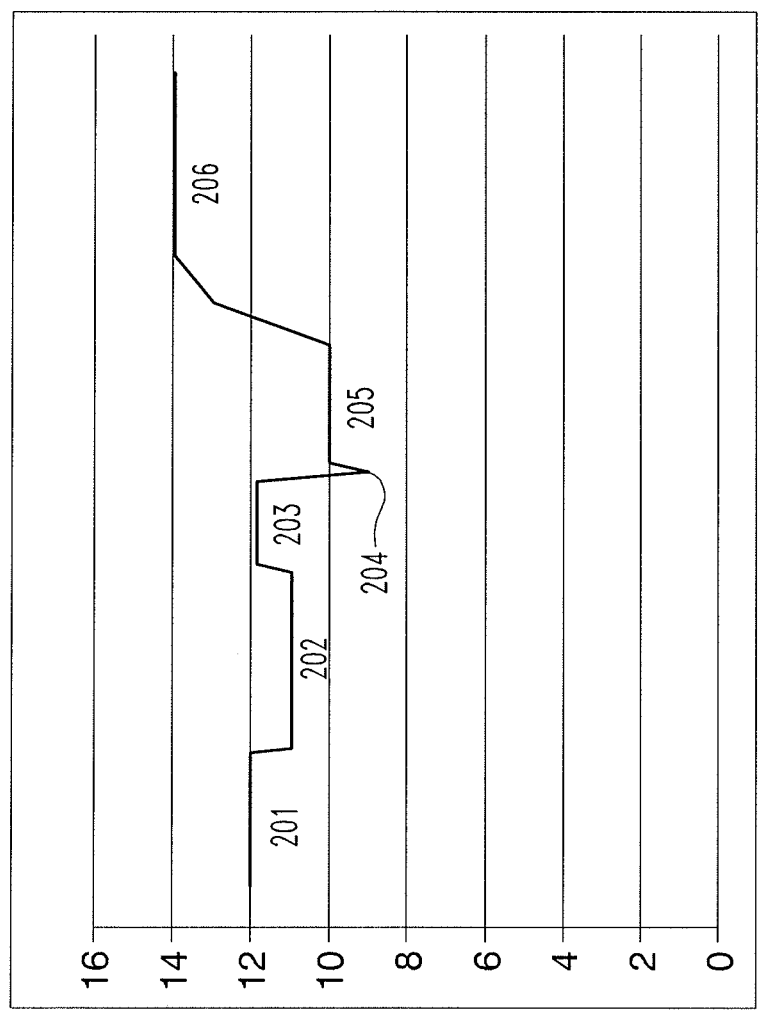
FIG. 4 is graph illustrating battery system voltage.

Further details regarding the reduction in voltage of battery system 104 incurred during operation of intake heater 108 and other engine accessories are shown in the graph of FIG. 4. It should be understood that the characteristics of the voltage of battery system 104 provided in the graph of FIG. 4 are shown for illustrative purposes only, and that the same may change due to a variety of factors, including but not limited to the age, health and configuration of battery system 104, the temperature of ambient air, and/or the configuration of intake heater 108 and starter 110. In the illustrated form, the voltage of battery system 104 is around 12 volts during stage 201 before operation of intake heater 108. However, while intake heater 108 is operated during stage 202, the voltage of battery system 104 is reduced to around 11 volts. Operation of intake heater 108 ceases after it has been operated for the period of time specified by heater command 144. Once operation of intake heater 108 is complete, the voltage of battery system 104 rebounds to around 12 volts during stage 203.

Following operation of intake heater 108, module 140 communicates with starter control module 150 which in turn provides starter command 152. Starter 110 is activated in response to starter command 152 in order to start engine 102. Performance evaluation module 146 is configured to measure an operating characteristic of starter 110 during its operation. More particularly, in the illustrated form, module 146 is also configured to control operation of sensor 115 such that it measures a voltage reduction (Starter_Delta) of battery system 104 incurred during operation of starter 110, and in particular during the initial operation of starter 110. More specifically, the graph of FIG. 4 illustrates that the voltage of battery system 104 decreases from around 12 volts during stage 203 to around 9 volts at the start 204 of stage 205. The start 204 of stage 205 corresponds to the activation or initial operation of starter 110, and may last for a relatively short period of time. Once starter 110 has been activated, the voltage of battery system 104 increases to around 10 volts during the remaining operation of starter 110 until stage 205, is complete at which point the voltage of battery system 104 increases to around 14 volts after engine 102 has been started in stage 206.

In the form currently described, Starter_Delta refers to the amount by which the voltage of battery system 104 is reduced during activation or initial operation of starter 110 at the start 204 of stage 205. Starter_Delta can be obtained by subtracting the voltage of battery system 104 measured during activation or initial operation of starter 110 at start 204 from the voltage of battery system 104 measured during stage 203 before activation of starter 110. In alternative forms, it should be understood that Starter_Delta may refer to a different value, such as the voltage of battery system 104 at activation or initial operation of starter 110 or during other operation of starter 110 during stage 205. While not previously discussed, it should be understood that in one or more forms controller 114 may be further configured to limit or prevent operation of other accessories during operation of intake heater 108 and starter 110 in order to avoid interference with the calculations of Heater_Delta and Starter_Delta.

Performance evaluation module 146 is further configured to use Heater_Delta and Starter_Delta to evaluate the performance of intake heater 108. In the illustrated form, module 146 begins using Heater_Delta and Starter_Delta to evaluate performance of intake heater 108 in response to receiving an indication from engine sensor conditions 154 that one of crankshaft movement or operation of engine 102 has been sensed by sensor 116 in response to operation of starter 110. This indication suggests that starter 110 is properly functioning and likewise validates the use of Starter_Delta in carrying out the performance evaluation of intake heater 108. In the event engine sensor conditions 154 do not provide this indication, module 146 may communicate with malfunction indicator control module 156 which in turn provides indicator command 158 for illuminating a malfunction indicator lamp of vehicle 902 indicative of, for example, a faulty battery system 104 or improper functioning of starter 110. In other forms however, it should be understood that module 146 may begin evaluating performance of intake heater 108 without receiving or independent of engine sensor conditions 154.

In one non-limiting form, performance evaluation module 146 relates Heater_Delta and Starter_Delta to provide a first value (X). For example, in one non-limiting approach module 146 is configured to perform the following calculation:

$$\text{Heater\_Delta}/\text{Starter\_Delta} = X$$

Once the first value X has been calculated, module 146 compares it to a predetermined value (Y) and then characterizes performance of intake heater 108 based on this comparison. For example, in one non-limiting approach, module 146 is configured to determine if the following relationship exists between X and Y:

$$X \leq Y$$

If the foregoing, predefined relationship exists between X and Y, then module 146 concludes that intake heater 108 is properly functioning. If however this relationship does not exist between X and Y, then module 146 concludes that a decrease in performance or function, including failure, of intake heater 108 has occurred. In response to this conclusion, module 146 communicates with malfunction indicator control module 156 which in turn provides indicator command 158 for illuminating a malfunction indicator lamp of vehicle 902 indicative of decreased performance or function of intake heater 108.

While not previously discussed, it should be understood that Y is a calibratible value that may be predetermined through experimentation and then stored in controller 114. For example, empirical testing may be performed on a plurality of fully functioning systems each including different configurations for one or more of battery system 104, intake heater 108, and starter 110. During this testing, Heater_Delta and Starter_Delta measurements can be obtained and compared in the manners discussed above. Proper functioning of intake heater 108 during this testing can be confirmed by, amongst other approaches, measuring its resistance, using a known resistance of heater 108 to determine if the measured voltage reduction for the same is correct for a given configuration of battery system 104, and/or measuring the heat it provides in intake 106. Further, proper functioning or starter 110 during this testing can be confirmed by sensing crankshaft movement or operation of engine 102, just to provide a few non-limiting examples.

After the testing is completed and all values for X resulting from the comparison of Heater_Delta and Starter_Delta for each individual test have been determined, the value for X representing the most extreme comparison for Heater_Delta and Starter_Delta is chosen to be saved in controller 114 as value Y in order to ensure performance evaluation module 146 is capable of evaluating performance of intake heater 108 across a variety of different configurations of battery system 104, intake heater 108 and starter 110. By way of non-limiting example, in the above described approach for evaluating performance of intake heater 108, the largest value for X obtained during the testing is saved in controller 114 for value Y such that performance evaluation module 146 is capable of evaluating performance of intake heater 108 across all configurations. Similarly, it should be understood that this configuration allows performance evaluation module 146 to evaluate the performance of intake heater 108 notwithstanding, for example, the configuration of battery system 104 and/or ambient air temperature.

Still, other approaches for evaluating the performance of intake heater 108 may be implemented by module 146. For example, in another non-limiting form, performance evaluation module 146 provides first value X by performing the following:

$$\text{Starter\_Delta} - \text{Heater\_Delta} = X$$

Module 146 then compares first value X to a predetermined value (Y) and then characterizes performance of intake heater 108 based on this comparison. For example, in one non-limiting approach, module 146 is configured to determine if the following relationship exists between X and Y:

$$X \geq Y$$

If the foregoing relationship exists between X and Y, then module 146 concludes that intake heater 108 is properly functioning. If however this relationship does not exist between X and Y, then module 146 concludes that a decrease in performance or function, including failure, of intake heater 108 has occurred. In response to this conclusion, module 146 communicates with malfunction indicator control module 156 which in turn provides indicator command 158 for illuminating a malfunction indicator lamp of vehicle 902 indicative of decreased performance or function of intake heater 108. While not previously discussed, it should be understood that the value for Y used in this approach may be determined through experimental testing carried out in a manner similar to that described above.

It should be understood that the above described approaches for using Heater_Delta and Starter_Delta to determine or evaluate performance of intake heater 108 are not limiting, and that module 146 may be configured to use Heater_Delta and Starter_Delta to evaluate performance of intake heater 108 through one or more alternative approaches. In addition, it should be also be understood that performance evaluation module 146 may also be configured to determine or evaluate performance of intake heater 108 based on one or more different operating characteristics of intake heater 108 and starter 110. For example, in one alternative form, module 146 is configured to relate resistances measured in connection with individual operation of intake heater 108 and starter 110 with a suitable meter, such as an ohm meter. The resulting value may then be compared to a predetermined value which is calculated by relating resistances of a fully operational intake heater 108 and starter 110 measured through testing performed in a manner similar to that discussed above. Performance evaluation of intake heater 108 may then be based on this comparison. In another alternative form, module 146 is configured to relate amperages measured in connection with individual operation of intake heater 108 and starter 110 with a suitable meter, such as an ammeter. The resulting value may then be compared to a predetermined value which is calculated by relating amperages of a fully operational intake heater 108 and starter 110 measured through testing performed in a manner similar to that discussed above. Performance evaluation of intake heater 108 may then be based on this comparison. It is also contemplated that performance evaluation of intake heater 108 may be performed using a combination of any of the foregoing operating characteristics of intake heater 108 and starter 110. In addition, while not previously discussed, it should be understood that module 146 may be further configured to determine a degree of operability of intake heater 108 based on one or more of the evaluation approaches described above, and similarly provided a quantitative value characteristic of the operation of intake heater 108.

The foregoing approaches for determining or evaluating performance of intake heater 108 may also be based on using an operating characteristic associated with intake heater 108 and an engine accessory other than starter 110. In addition, use of performance evaluation module 146 to determine performance of accessories other than intake heater 108 are also possible, and it should be appreciated that forms in which the evaluation of intake heater 108 performance can be performed outside or independent of the described starting procedure are also contemplated.

Figure 5:
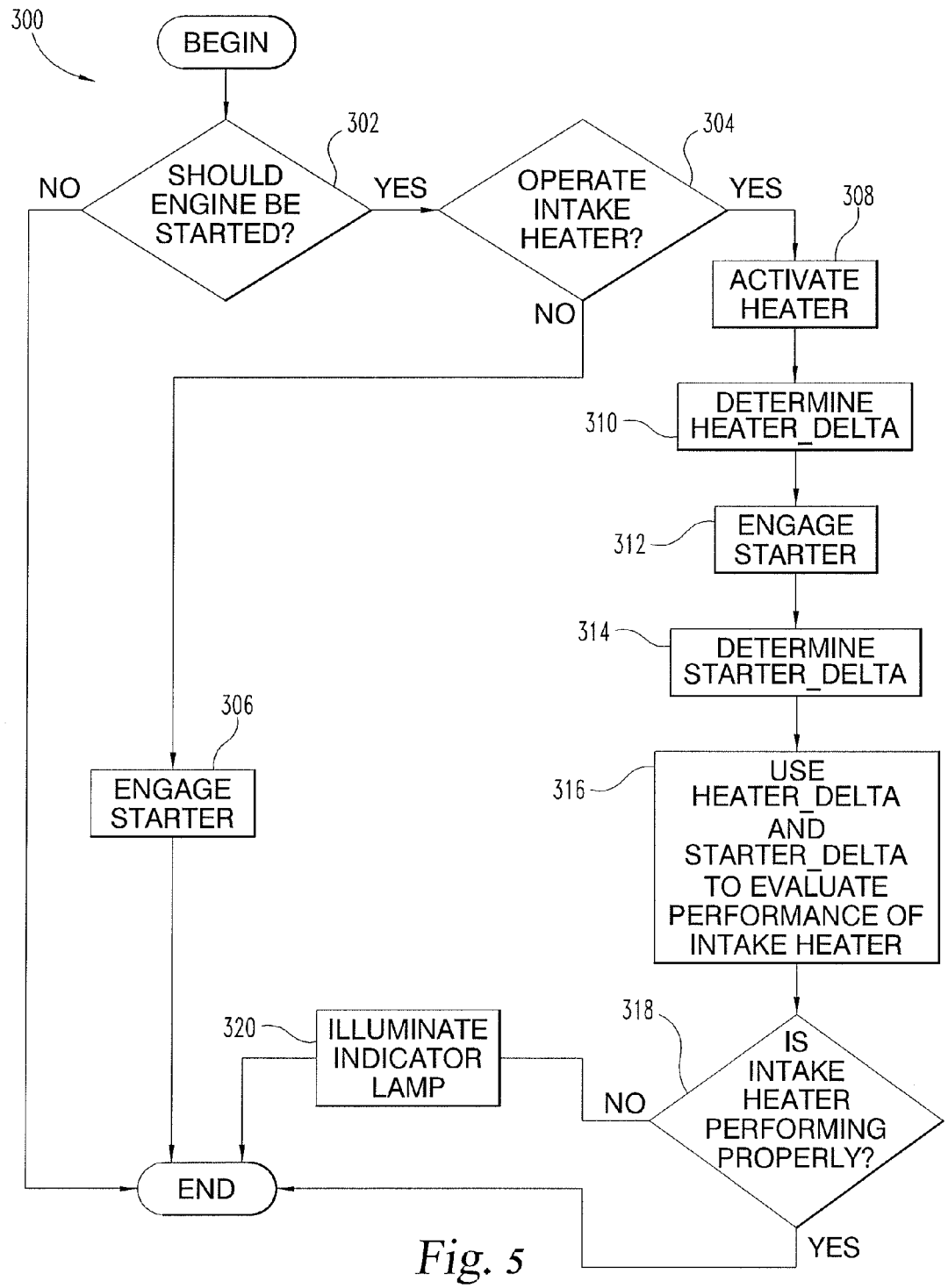
FIG. 5 is a schematic flow diagram illustrating a technique for evaluating performance of a component of the internal combustion engine of FIG. 1.

Referring now to FIG. 5, further details regarding one exemplary technique 300 for using system 100 to evaluate performance of intake heater 108 and perform a start-up procedure of engine 102 will now be provided in connection with the schematic flow diagram illustrated in therein. Technique 300 includes an operation 302 to determine if engine 102 should be started. The determination that engine 102 should be started may be based on activation of an engine ignition switch or receiving an engine ignition command. In response to determining that engine 102 should not be started, technique 300 ends. However, in response to determining that engine 102 should be started, technique 300 includes an operation 304 to determine if intake heater 108 should be operated. In response to determining that intake heater 108 should not be operated, technique 300 continues with operation 306 in which starter 110 is engaged, after which technique 300 ends.

If intake heater 108 should be operated, technique 300 includes operation 308 in which intake heater 108 is activated, and operation 310 in which Heater_Delta is determined. Following determination of Heater_Delta, starter 110 is engaged or activated in operation 312, and Starter_Delta is determined in operation 314. Technique 300 then proceeds with operation 316 in which the Heater_Delta and Starter_Delta are used to evaluate performance of intake heater 108 in the manner described herein above. In operation 318, it is determined if intake heater 108 is performing properly based on the evaluation performed in operation 316. If intake heater 108 is performing properly, technique 300 ends. However, if intake heater 108 is not performing properly, a malfunction indicator lamp is illuminated in operation 320 which notifies a user of vehicle 902 that intake heater 108 is not performing properly. In response, vehicle 902 may be serviced to remediate any performance issues of intake heater 108. Technique 300 ends after illumination of the malfunction indicator lamp.

Figure 6:
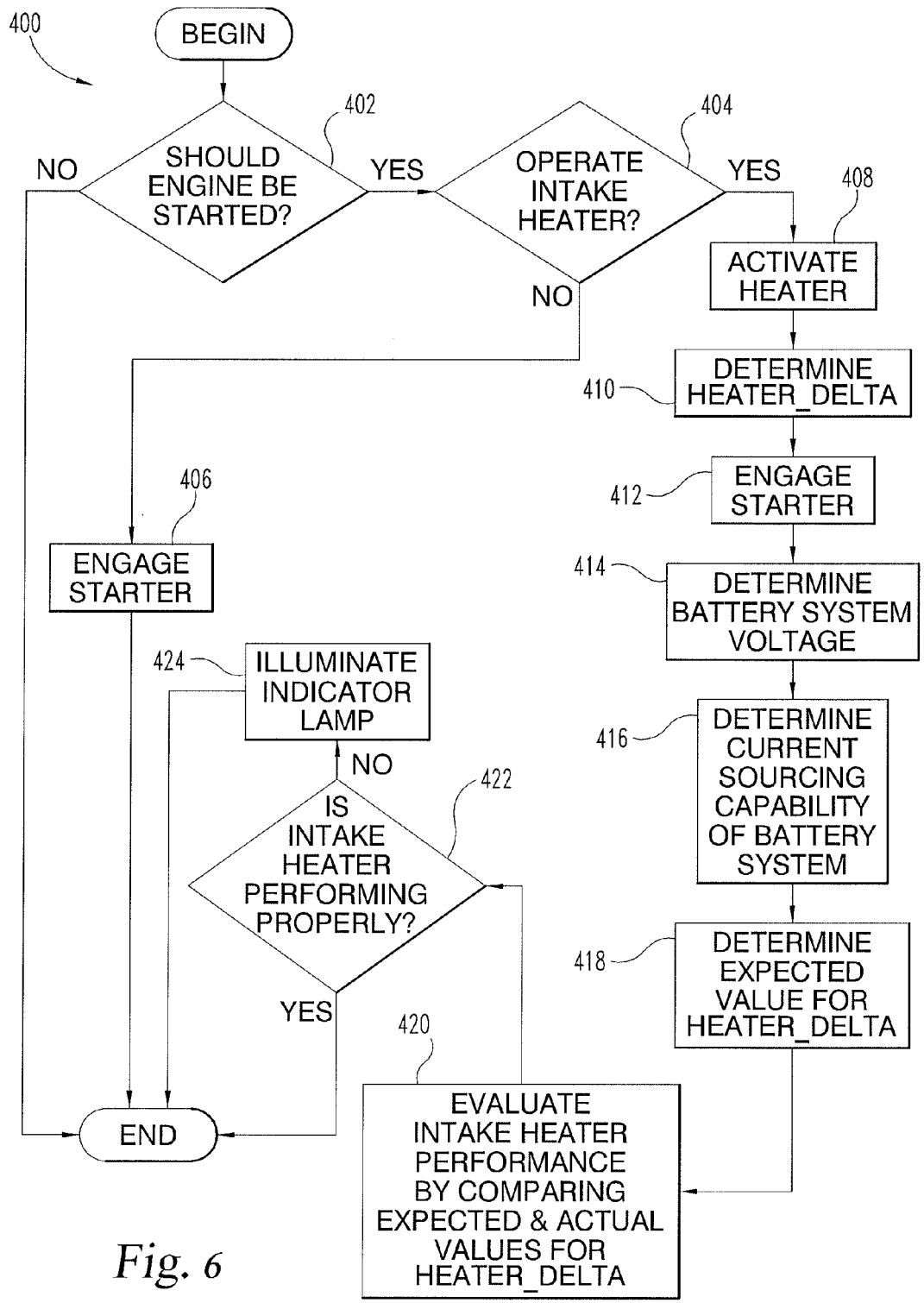
FIG. 6 is a schematic flow diagram illustrating another technique for evaluating performance of a component of the internal combustion engine of FIG. 1.

An alternative approach for evaluating performance of intake heater 108 is now described in connection with technique 400 shown in the schematic flow diagram illustrated in FIG. 6. In addition to evaluating performance of intake heater 108, technique 400 also performs a start-up procedure of engine 102. Technique 400 includes an operation 402 to determine if engine 102 should be started. The determination that engine 102 should be started may be based on activation of an engine ignition switch or receiving an engine ignition command. In response to determining that engine 102 should not be started, technique 400 ends. However, in response to determining that engine 102 should be started, technique 400 includes an operation 404 to determine if intake heater 108 should be operated. In response to determining that intake heater 108 should not be operated, technique 400 continues with operation 406 in which starter 110 is engaged, after which technique 400 ends.

If intake heater 108 should be operated, technique 400 includes operation 408 in which intake heater 108 is activated, and operation 410 in which Heater_Delta is determined. Following operation 410, starter 110 is engaged or activated in operation 412, and the voltage of battery system 104 is measured during operation of starter 110 in operation 414. In operation 416 of technique 400, the current sourcing capability of battery system 104 is determined. More particularly, in this operation, controller 114 is configured to calculate the current sourcing capability of battery system 104 using the voltage of battery system 104 measured during operation of starter 110 and a known resistance for starter 110 stored in controller 114. Alternatively, controller 114 may be configured to utilize look-up tables in which current sourcing capabilities of battery system 104 corresponding to different voltages of battery system 104 measured during operation of starter 110 are provided, and to select an appropriate value for the current sourcing capability of battery system 104 based on the voltage of battery system 104 measured during operation 414.

While not previously discussed, it should be appreciated that in one form operation 416 is carried out in response to receiving a signal from sensor 116 indicating, by way of non-limiting example, that one or both of crankshaft movement and operation of engine 102 has been sensed. Upon receiving this indication, controller 114 determines starter 110 is properly functioning and validates the usage of the voltage measured in connection with its operation in technique 400. In the event this indication is not received, controller 114 may be configured to provide a command for illuminating a malfunction indicator lamp of vehicle 902 indicative of, for example, a faulty battery system 104 or improper functioning of starter 110. Controller 114 may also be configured to terminate technique 400 in the event this indication is not received from sensor 116.

Once the current sourcing capability of battery system 104 is determined in operation 416, an expected value for Heater_Delta is calculated in operation 418. More particularly, in this operation, controller 114 is configured to calculate the expected value for Heater_Delta using the current sourcing capability of battery system 104 determined in operation 416 and a known resistance for intake heater 108 stored in controller 114. Alternatively, controller 114 may be configured to utilize look-up tables in which current sourcing capabilities of battery system 104 corresponding to different voltages of battery system 104 measured during operation of intake heater 108 are provided, and to select an appropriate value for the expected Heater_Delta based on the current sourcing capability of battery system 104 determined in operation 416.

Performance of intake heater 108 is then evaluated in operation 420, and in operation 422 it is determined if intake heater 108 is performing properly based on the evaluation performed in operation 420. More particularly, performance of intake heater 108 is evaluated in operation 420 by comparing the expected value for Heater_Delta determined in operation 418 and the actual value for Heater_Delta measured in operation 410. In one non-limiting form, controller 114 is configured to determine that a decrease in intake heater 108 performance has occurred if, for example, the actual value for Heater_Delta is less than the expected value for Heater_Delta calculated in operation 418. It should be understood however that other approaches for determining that a decrease in intake heater 108 performance has occurred based on comparing the expected value for Heater_Delta and the actual value for Heater_Delta are possible.

If it is determined in operation 422 that intake heater 108 is performing properly, then technique 400 ends. However, if intake heater 108 is not performing properly, a malfunction indicator lamp is illuminated in operation 424 which notifies a user of vehicle 902 that intake heater 108 is not performing properly. In response, vehicle 902 may be serviced to remediate any performance issues of intake heater 108. Technique 400 ends after illumination of the malfunction indicator lamp. While not previously discussed, it should be understood that technique 400 facilitates, amongst other things, performance evaluation of intake heater 108 regardless of the configuration of battery system 104, and that technique 400 may be used to evaluate performance of components other than intake heater 108. It is also contemplated that current sourcing capability of battery system 104 may be determined from an operating characteristic of starter 110 other than battery system voltage measured during its operation, and/or that it could be determined based on operating characteristics of an accessory other than starter 110. In addition, technique 400 may also include an operation that provides information to an indicator lamp or other display characterizing the health of battery system 104 based on the current sourcing capability of battery system 104 determined in operation 416.

As is evident from the figures and text presented above, a variety of embodiments according to the present invention are contemplated.

In one embodiment, a method includes determining a first voltage reduction of a battery system during operation of a heating component; determining a second voltage reduction of the battery system during operation of an engine accessory; and using the first and second voltage reductions to determine performance of the heating component. In one form of this embodiment, using the first and second voltage reductions to determine performance of the heating component includes relating the first and second voltage reductions to one another to provide a first value and comparing the first value to a predetermined value. In a further aspect of this form, comparing the first value to the predetermined value includes determining whether the first value has a predefined relationship with the predetermined value. Additional aspects of this form include indicating decreased performance of the heating component if the first value has a relationship with the predetermined value different from the predefined relationship. In one aspect, indicating decreased performance of the heating component includes illuminating a malfunction indicator lamp.

In another form of this embodiment, the heating component is an air intake heater. In still another form, the heating component is an in-cylinder heater. In yet another form, the engine accessory is a starter motor. In one aspect of this form, determining the second voltage reduction of the battery system includes measuring voltage drop incurred upon initiating operation of the starter motor. In still another form, using the first and second voltage reductions to determine performance of the heating component is performed in response to sensing at least one of crankshaft movement and engine operation.

In another embodiment, a method includes operating a heating component and measuring a first characteristic related to operation of the heating component; operating an engine accessory and measuring a second characteristic related to operation of the engine accessory; and evaluating performance of the heating component by relating the first and second characteristics to one another. One form of this method further includes providing a first value in response to relating the first and second characteristics to one another and comparing the first value to a predetermined value. In one aspect of this form, comparing the first value to the predetermined value includes determining whether the first value has a predefined relationship with the predetermined value. In a further aspect, the method further includes illuminating a malfunction indicator lamp in response to determining that the first value has a relationship with the predetermined value different from the predefined relationship.

In another form of this embodiment, the first and second characteristics are electrical characteristics. In still another form, the first characteristic corresponds to a first reduction in voltage of a battery system and the second characteristic corresponds to a second reduction in voltage of the battery system. In an additional form, the first characteristic corresponds to a first amount of current drawn by the heating component and the second characteristic corresponds to a second amount of current drawn by the engine accessory. In yet another form, the heating component is an air intake heater. In another form, the heating component is an in-cylinder heater. In still another form, the engine accessory is a starter motor. In one aspect of this form, measuring the second characteristic related to operation of the engine accessory is performed during initial operation of the starter motor. In another form, relating the first and second characteristics to one another is performed in response to sensing at least one of crankshaft movement and engine operation.

In another embodiment, a system includes an internal combustion engine including a heating component and at least one accessory. The system also includes a controller structured to provide a first value by relating a first operating characteristic of the heating component and a second operating characteristic of the at least one engine accessory, and to evaluate performance of the heating component by comparing the first value to a predetermined value. In one form, the controller is further structured to provide a signal for illumination of a malfunction indicator in response to determining that the first value has a relationship with the predetermined value different from a predefined relationship. In another form, the first and second operating characteristics are electrical characteristics related to operation of the heating component and the at least one accessory. In still another form, the engine accessory is a starter motor and the heating component is one of an air intake heater and an in-cylinder heater. In one aspect of this form, the controller is further structured to evaluate performance of the heating component in response to sensing at least one of crankshaft movement and engine operation.

In yet another embodiment, a system includes an internal combustion engine including a heating component, a battery system, and at least one accessory. The system also includes a controller structured to determine current sourcing capability of the battery system based on a resistance of the starter motor and a voltage of the battery system measured during operation of the starter motor, calculate a first voltage reduction expected during operation of the heating component, and compare the first voltage reduction and an actual voltage reduction of the battery system measured during operation of the heating component to determine performance of the heating component. In one form, the controller is further structured to determine decreased performance of the heating component if the actual voltage reduction is less than the first voltage reduction. In one aspect of this form, the controller is further structured to provide a malfunction indicator lamp signal in response to determining decreased performance of the heating component. In another form, the controller is further structured to determine current sourcing capability of the battery system in response to determining crankshaft movement or operation of the internal combustion engine.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred, more preferred or exemplary utilized in the description above indicate that the feature so described may be more desirable or characteristic, nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method, comprising:
    determining a first voltage reduction of a battery system during operation of a heating component associated with an internal combustion engine;
    determining a second voltage reduction of the battery system during operation of an engine accessory, wherein the engine accessory includes a starter and operation of the engine accessory includes starting the internal combustion engine with the starter after operation of the heating component to determine the first voltage reduction, the second voltage reduction being determined during the starting;
    using the second voltage reduction to determine an expected voltage reduction during operation of the heating component; and
    determining a performance of the heating component from the first voltage reduction and the expected voltage reduction.

2. The method of claim 1, wherein determining the performance of the heating component includes relating the first and second voltage reductions to one another to provide a first value and comparing the first value to a predetermined value.

3. The method of claim 2, wherein comparing the first value to the predetermined value includes determining whether the first value has a predefined relationship with the predetermined value.

4. The method of claim 3, which further includes indicating decreased performance of the heating component if the first value has a relationship with the predetermined value different from the predefined relationship.

5. The method of claim 4, wherein indicating decreased performance of the heating component includes illuminating a malfunction indicator lamp.

6. The method of claim 1, wherein the heating component is an air intake heater.

7. The method of claim 1, wherein the heating component is an in-cylinder heater.

8. The method of claim 1, wherein determining the second voltage reduction of the battery system includes measuring voltage drop incurred upon initiating operation of the starter.

9. The method of claim 1, wherein using the second voltage reduction is performed in response to sensing at least one of crankshaft movement and engine operation.

10. A method, comprising:
    operating a heating component and measuring a first characteristic related to operation of the heating component associated with an internal combustion engine;
    operating an engine accessory and measuring a second characteristic related to operation of the engine accessory, wherein operating the engine accessory occurs after operation of the heating component to measure the first characteristic, the second characteristic being measured during operation of the engine accessory;
    determining a predetermined value for the first characteristic that is based on the second characteristic; and
    evaluating performance of the heating component by relating the first and second characteristics to one another and to the predetermined value.

11. The method of claim 10, which further includes providing a first value in response to relating the first and second characteristics to one another and comparing the first value to the predetermined value.

12. The method of claim 11, wherein comparing the first value to the predetermined value includes determining whether the first value has a predefined relationship with the predetermined value.

13. The method of claim 12, which further includes illuminating a malfunction indicator lamp in response to determining that the first value has a relationship with the predetermined value different from the predefined relationship.

14. The method of claim 10, wherein the first and second characteristics are electrical characteristics.

15. The method of claim 10, wherein the first characteristic corresponds to a first reduction in voltage of a battery system and the second characteristic corresponds to a second reduction in voltage of the battery system.

16. The method of claim 10, wherein the first characteristic corresponds to a first amount of current drawn by the heating component and the second characteristic corresponds to a second amount of current drawn by the engine accessory.

17. The method of claim 10, wherein the heating component is an air intake heater.

18. The method of claim 10, wherein the heating component is an in-cylinder heater.

19. The method of claim 10, wherein the engine accessory is a starter.

20. The method of claim 19, wherein measuring the second characteristic related to operation of the engine accessory is performed during initial operation of the starter in starting the internal combustion engine after operate the heating component.

21. The method of claim 10, wherein relating the first and second characteristics to one another is performed in response to sensing at least one of crankshaft movement and engine operation.

22. A system, comprising:
an internal combustion engine including a heating component and at least one accessory, wherein the heating component is one of an air intake heater and an in-cylinder heater; and
a controller structured to provide a first value by relating a first operating characteristic of the heating component determined by operation of the heating component before the internal combustion is started and a second operating characteristic of the at least one accessory during operation of the at least one accessory, the controller further being structured to determine a predetermined value for the first operating characteristic based on the second operating characteristic and to evaluate performance of the heating component by comparing the first value to the predetermined value.

23. The system of claim 22, wherein the controller is further structured to provide a signal for illumination of a malfunction indicator in response to determining that the first value has a relationship with the predetermined value different from a predefined relationship.

24. The system of claim 22, wherein the first and second operating characteristics are electrical characteristics related to operation of the heating component and the at least one accessory.

25. The system of claim 22, wherein the engine accessory is a starter motor and the second operating characteristic is determined during starting of the internal combustion engine with the starter motor.

26. The system of claim 25, wherein the controller is further structured to evaluate performance of the heating component in response to sensing at least one of crankshaft movement and engine operation.

27. A system, comprising:
an internal combustion engine including a heating component, a battery system, and at least one accessory, wherein the accessory is a starter motor and the heating component is one of an air intake heater and an in-cylinder heater; and
a controller structured to determine a current sourcing capability of the battery system based on a resistance of the starter motor and a voltage of the battery system measured during operation of the starter motor to start the internal combustion engine, calculate a first voltage reduction of the battery system expected during operation of the heating component based on the current sourcing capability of the battery stem determined during starting the internal combustion engine, and compare the first voltage reduction and an actual voltage reduction of the battery system measured during operation of the heating component before starting the internal combustion engine to evaluate performance of the heating component.

28. The system of claim 27, wherein the controller is further structured to determine decreased performance of the heating component if the actual voltage reduction is less than the first voltage reduction.

29. The system of claim 28, wherein the controller is further structured to provide a malfunction indicator lamp signal in response to determining decreased performance of the heating component.

30. The system of claim 27, wherein the controller is further structured to determine current sourcing capability of the battery system in response to determining crankshaft movement or operation of the internal combustion engine.

\* \* \* \* \*